(12) United States Patent
Kneisel et al.

(10) Patent No.: US 8,010,934 B2
(45) Date of Patent: Aug. 30, 2011

(54) METHOD AND SYSTEM FOR TESTING BIT FAILURES IN ARRAY ELEMENTS OF AN ELECTRONIC CIRCUIT

(75) Inventors: Joachim Kneisel, Berlin (DE); Otto Torreiter, Leinfelden-Echterdingen (DE)

(73) Assignee: International Business Machines Corporation, Armonk, NY (US)

( * ) Notice: Subject to any disclaimer, the term of this patent is extended or adjusted under 35 U.S.C. 154(b) by 566 days.

(21) Appl. No.: 12/127,900

(22) Filed: May 28, 2008

(65) Prior Publication Data

US 2008/0301596 A1  Dec. 4, 2008

(30) Foreign Application Priority Data

May 31, 2007 (EP) ..................................... 07109331

(51) Int. Cl.
*G06F 17/50* (2006.01)
(52) U.S. Cl. ......... 716/136; 716/103; 716/106; 716/112
(58) Field of Classification Search .................. 716/103, 716/106–107, 110–112, 136; 714/28–30, 714/724–726, 766
See application file for complete search history.

(56) References Cited

U.S. PATENT DOCUMENTS

| 6,539,503 | B1 * | 3/2003 | Walker .......................... 714/703 |
| 6,829,572 | B2 | 12/2004 | Crouse, II et al. |
| 2003/0226062 | A1 * | 12/2003 | Gender et al. .................. 714/38 |

OTHER PUBLICATIONS

U.S. Appl. No. 10/035,474, filed Oct. 25, 2001, Barlh et al.

* cited by examiner

*Primary Examiner* — Paul Dinh
(74) *Attorney, Agent, or Firm* — Schmeiser, Olsen & Watts; Richard M. Kotulak

(57) ABSTRACT

The invention relates to a method and system for testing bit failures in array elements of an electronic circuit. Said method comprising the steps of changing an original hardware representation (DD) of the array such that errors can be injected in a memory by manipulation of associated read and/or write logic of the memory via input signals, building an emulator model (SME) from said changed hardware representation for emulating the array, and injecting errors into the changed hardware representation for determining the array to get stick capabilities.

19 Claims, 3 Drawing Sheets

METHOD AND SYSTEM FOR TESTING BIT FAILURES IN ARRAY ELEMENTS OF AN ELECTRONIC CIRCUIT

BACKGROUND OF THE INVENTION

The present invention relates to the field of hardware emulation and testing.

A critical step in the characterization and bringup test of integrated circuits is the test of the array elements or memories they contain. An array element or memory array, in the sense of the present text is, e.g., an L2 cache. It comprises memory cells (the array memory) as well as associated read and write logic to access these cells.

Complex test programs are executed on wafer test systems (testers) in order to check the quality of the arrays. One important function of these test programs is to determine the exact location of failing single-bit memory cells. The process is called Bit Fail Mapping, because maps of bit fails are constructed that provide insight into the weaknesses of the circuit and valuable feedback for circuit design and technology.

Traditionally, developing these test programs for the wafer test systems is extremely difficult because there is no reliable test object against which the test programs could be checked for correctness. Old circuits cannot be used easily as the test programs are highly customized for a specific chip. Furthermore, the actual chip does not provide reliable single bit fails, as it is the device under test (DUT). Also, when the actual chip is available, the test program must already be error-free, and its development should already be complete.

Running the developed test programs against a DUT simulation is not practically possible. Running the test program on a simulation system requires multiple transformation steps. These too are likely to introduce new errors, thereby rendering such a solution not practical.

Emulation lends itself as a solution to this problem. Logic circuits can be emulated by directly attaching an emulation system to the wafer tester. Hence, logic emulation without error injection is commonly used. Also, error injection is possible, since non-array signals can be controlled during the runtime of the emulation system. Without error injection, the array circuits can be emulated. In contrast, emulation with error injection is practically impossible for arrays. The reason is that the arrays of the design are mapped to internal memories of the emulation machine. As such, they are not controllable by software running on the emulation machine. Single array cells cannot be simply stuck by software on the emulation machine. Bit Fail Mapping, however, requires single array cells to be stuck reliably and without impact on emulation performance.

As a remedy one could model arrays as single latches on the emulation machine. But the required amount of emulation resource for this approach is prohibitive. In practice, the test programs are first developed without testing, and checked using actual chips after they arrived from the wafer fabrication. To provide reliable injected errors on actual chips, single bit cells are physically destroyed using the FIB (Focused Ion Beam) method. Such a treatment of wafers is expensive and very time-consuming, since it is done by external companies. It is also error-prone, because the different logical and physical layout of a memory needs to be taken into account.

U.S. Pat. No. 6,829,572 discloses a method and system in a logic simulator machine for overriding a value of a net in an array during execution of a test routine while the logic simulator machine is simulating a logic design. Although this principally enables sticking of single array cells in a simulation system, sticks have to be renewed per simulation cycle.

White paper 'Accelerated Hardware/Software Co-Verification' of Cadence Design Systems, Inc. discloses a logic simulator for modeling an ASIC (Application Specific Integrated Circuit) and all other hardware components in a logic design except the processor and memory. The memory is 'modeled' by workstation memory, which as a result prevents injection of control and stuck of errors, and thus limits the possibility of emulating erroneous arrays.

SUMMARY OF THE INVENTION

It is therefore an object of present invention to provide a method and system for reliable and fast testing of memory hardware.

This object is achieved by the invention as defined in the independent claims. Further advantageous embodiments of the present invention are defined in the dependent claims.

In one aspect of the invention there is provided a method of manipulating a representation of memory array hardware, said method comprising the steps of modifying a representation of an electronic circuit such that errors can be injected in the array by manipulation of associated read and/or write logic of the array via input signals, building an emulator model from said the modified representation, and injecting errors into an emulation of said emulator model for determining the array to get stick (stuck-at fault) capabilities.

One important point of the inventive manipulation method is that the array itself is not changed, only its associated access logic, either read or write. Therefore, error injection signals can be accessed normally on an emulator. The array can still be mapped to the emulator internal memories, which means that space is saved. Since the model is changed such that array sticks are naturally integrated, no runtime overhead that provides interrupts every cycle through emulator control code is necessary. Therefore, the approach is faster than existing solutions. Furthermore, no read/write path is added, so evaluation takes place only when array is really accessed. Therefore, no additional array evaluations are required compared to a model without such stick capability. The inventive method is not restricted to emulation of array hardware alone, but may the same be applied for simulation applications as well.

The original hardware representation can be changed before and/or during the emulator model building process. Thus, introduction of array sticks can be carried out in two ways. In the first way it is done manually by user interaction, wherein the user provides e.g. a changed HDL (Hardware Description Language) representation of an array that should get stick capabilities. In the second way it is done automatically during model build process. In the latter case, the user sets a configuration option to determine the array(s) to get stick capabilities. The representation of the array is then changed during the build process for the emulation model e.g. between a compile and a flatten step. The change step does not need to take place at a specific point in the model build process. It can be executed at several places in the process.

During such step, it is preferred that said input signals can be controlled at emulation runtime, e.g. via command line input. Such control increases reliability of the error injection. For evaluation and testing purposes, said memory errors introduced into the emulator model can also be turned on at configurable memory addresses. This is especially helpful in a further step of stimulating the emulator model for detecting said errors at defined positions.

In a further aspect of the invention a method of compiling a representation of memory array hardware in the above building step of an emulator model is provided, wherein a hierarchical netlist is used, said method comprising the steps of identifying a desired array memory signal by type or attribute from the netlist, identifying an assignment of said array memory signal to a data output signal in said netlist, and inserting an equivalent of error injection behavioral in between the data output signal and the array memory signal.

One important aspect of the inventive compilation method is that the netlist, having a design block implementing the above additional steps, allows for reliable error injection at arbitrary bit positions within the array. A further advantage is that the facilities related to error injection are design nets like VHDL (Virtual Hardware Description Language) signals, which can be changed dynamically during the runtime of the emulation model. Error injection may then use an existing read/write port, such that runtime code of the emulation model translates an array stick into the designed instantiation of said port. This enables debugging of a test environment at runtime before the silicon arrives. The test environment may use an emulation machine in conjunction with a tester.

Hence, in another aspect of the invention there is also provided an emulation computer system adapted for performing the methods described herein, which is connectable to tester hardware. Since the arrays can be manipulated on the machine, they can be tested hard and fast. Said emulation computer system is preferably used for checking the error detection behavioral of a wafer tester device. If such device reliably recognizes the errors injected into the emulator model, error detection in real silicon is improved.

BRIEF DESCRIPTION OF THE DRAWINGS

Manipulation of hardware representation according to present invention will be explained in closer detail throughout the following by way of an example. Same parts or parts of equal effect are denoted by the same reference numerals. It is shown in.

DETAILED DESCRIPTION

Figure 1:
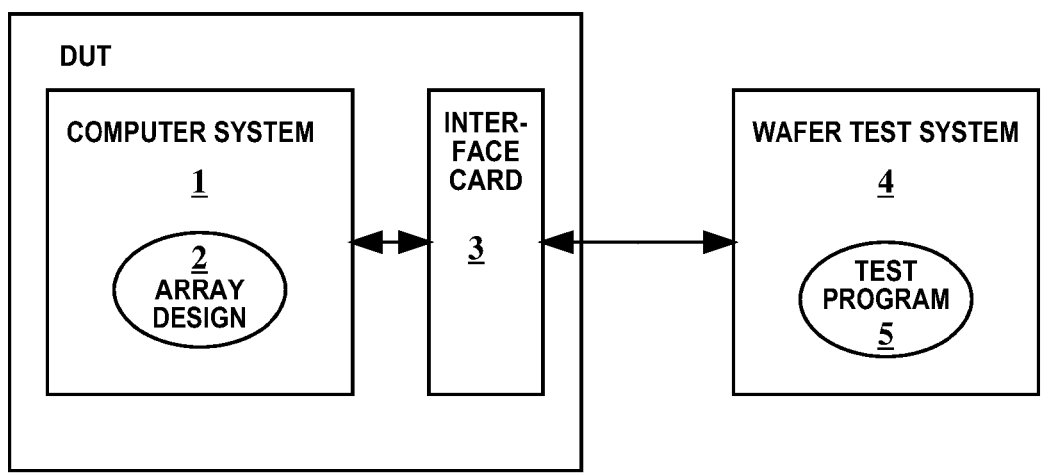
FIG. 1 a block diagram illustrating a test environment for memory arrays according to the invention.

FIG. 1 shows a block diagram illustrating a test environment for memory arrays according to the invention. Such environment must be prepared using certain methods and operated according to a distinct scheme in distinct order. The invention further requires a certain set of different systems that are connected to each other.

An emulation computer system 1 executing an especially adapted representation 2 of an array design acts as device under test DUT. Said system 1 is connected via interface card 3 with a wafer test system 4 having a test program 5. The adapted representation 2 of the device under test is executed such that it acts as a virtual test object for the test program 5 that controls the operation of the wafer test system 4. The representation 2 of the design is generated automatically during the model build process. The changes are not generally in the array cells, but in the surrounding read and/or write logic.

As for executing the complete testing process, the wafer test system 4 is connected to the emulation computer system 1 via the interface subsystem 3. On the emulation computer system 1, an adapted representation 2 of the device under test is loaded. The representation of the device under test is changed from the original such that errors can be injected into the read or write logic of the memory. The changed representation 2 is generated automatically from the original design source. Commands on the emulation system 1 turn on reliably injected errors (virtual bit fails) at configurable memory addresses. The test program 5 under development is executed on the tester 4. It stimulates the DUT representation on the emulation system 1 and receives the output of the DUT representation via the interface subsystem 3. The adapted representation 2 of the device under test is executed on the emulation system 1. It acts as the test object needed for the checking of the test programs correctness.

Using this approach, a virtual test object has been created, against which programs for Bit Fail Mapping can be developed and checked. It enables virtual Bit Fail Mapping. This work can be done at leisure, before the actual chip is physically available. The time-consuming debugging process is shifted to a phase where tester time is cheapest. The bit fails of the virtual test object are reliable and configurable, therefore allowing for thorough testing of the developed tester programs. This results in additional timesavings when tester time is most expensive. Giving known-good chips to external companies and physically damage them in order to generate physical test objects is no longer necessary. Thus, the overall time for bit-fail mapping is shortened.

The adapted representation 2 of the device under test is generated automatically from the original description of the chip design, i.e. during the process of building an emulation model of the hardware description language (HDL) representation of the design under test.

A change in the design representation is necessary, because arrays are represented by internal memories of the emulation system for performance and resource reasons. Hence, array cells cannot be manipulated directly in the emulated representation of the design.

The change is targeted at the write or the read logic of the array through the introduction of additional signals and constants. Thus the write or read vector at certain addresses can be manipulated to yield the desired erroneous value in arbitrary bits. Through the use of normal signals the errors can be turned on and off by issuing commands at the command line interface of the emulation system.

Thus, the HDL description of the array itself is not manipulated, but the description of the directly adjacent logic blocks is. Without this invention, error injection through emulation would be difficult.

An example description of a memory block in VHDL language for clarifying what automatic changes are applied to the design during the model build process is given below and described throughout the following:

```
ENTITY memory_block IS
  PORT(
    rwport0       : IN std_ulogic_vector(0 to 4);
    rwdataout0    : OUT std_ulogic_vector(0 to 41);
    rwdatain0     : IN std_ulogic_vector(0 to 41);
    rwren0        : IN std_ulogic;
    rwwen0        : IN std_ulogic );
  END memory_block;
ARCHITECTURE original OF memory_block IS
  --Useful constants
  CONSTANT addrlen    : integer := 5;
  CONSTANT width      : integer := 42;
  CONSTANT addrtotal  : integer := 32;
  CONSTANT arraytotal : integer := 32;
  -- The type definition for the RAM
  TYPE RAM_TYPE IS ARRAY(0 TO addrtotal-1) OF
```

-continued

```
    std_ulogic_vector(0 TO width-1);
--The RAM
    SIGNAL data_array : RAM_TYPE;
    BEGIN - Architecture
--writes into the array
    WRITES : PROCESS (rwport0, rwwen0, rwdatain0)
    BEGIN -- WRITES
        -- read/write port 0 enabled
        IF (rwwen0 = '1') THEN
            data_array(TConv(rwport0)) <= rwdatain0;
        END IF;
    END PROCESS WRITES;
--reads from array
    READS : PROCESS (rwport0, rwren0)
    BEGIN -- READS
        IF (rwren0 = '1') THEN
            rwdataout0 <= data_array(TConv(rwport0));
        ELSE
            rwdataout0 <= (others => '1');
        END IF;
    END PROCESS READS;
END original;
```

During the model build compile process, the representation is automatically changed to allow for bit error injection capability. To understand how this is effectuated, it is necessary to explain the traditional model build process.

Figure 2A:
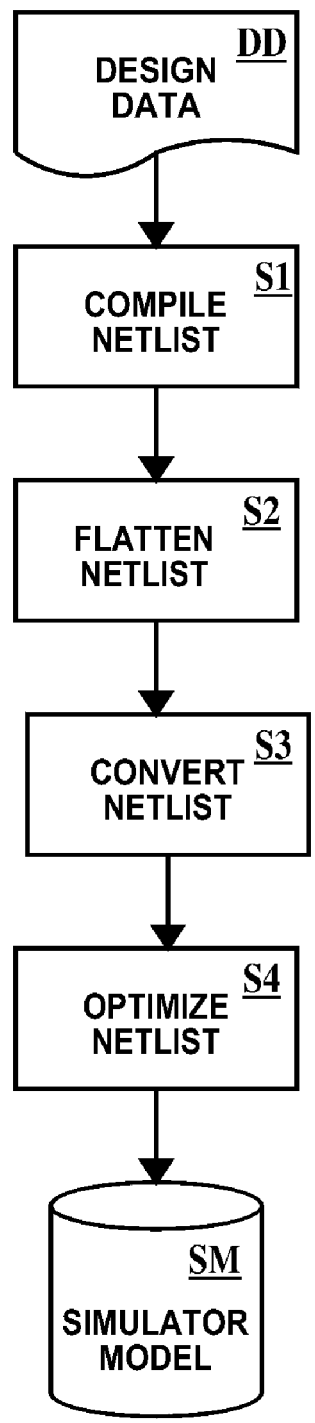
FIG. 2a a flow chart illustrating a traditional emulator model build process for memory arrays, and FIG. 2b a flow chart illustrating the emulator model build process according to the invention.

FIG. 2a shows a flow chart illustrating a traditional emulator model build process for memory arrays. In S1 (Step 1) the original HDL description of a design DD (Design Data) is first compiled into a hierarchical netlist. The netlist is then flattened in S2 (Step 2), i.e. the hierarchy information is stripped from the netlist. Afterwards, the flat netlist is converted in S3 (Step 3) into the representation required for the simulation/emulation system 1. Finally, specific optimization for the target simulator/emulator model SM (Simulator Model) can be carried out in S4 (Step 4).

Figure 2B:
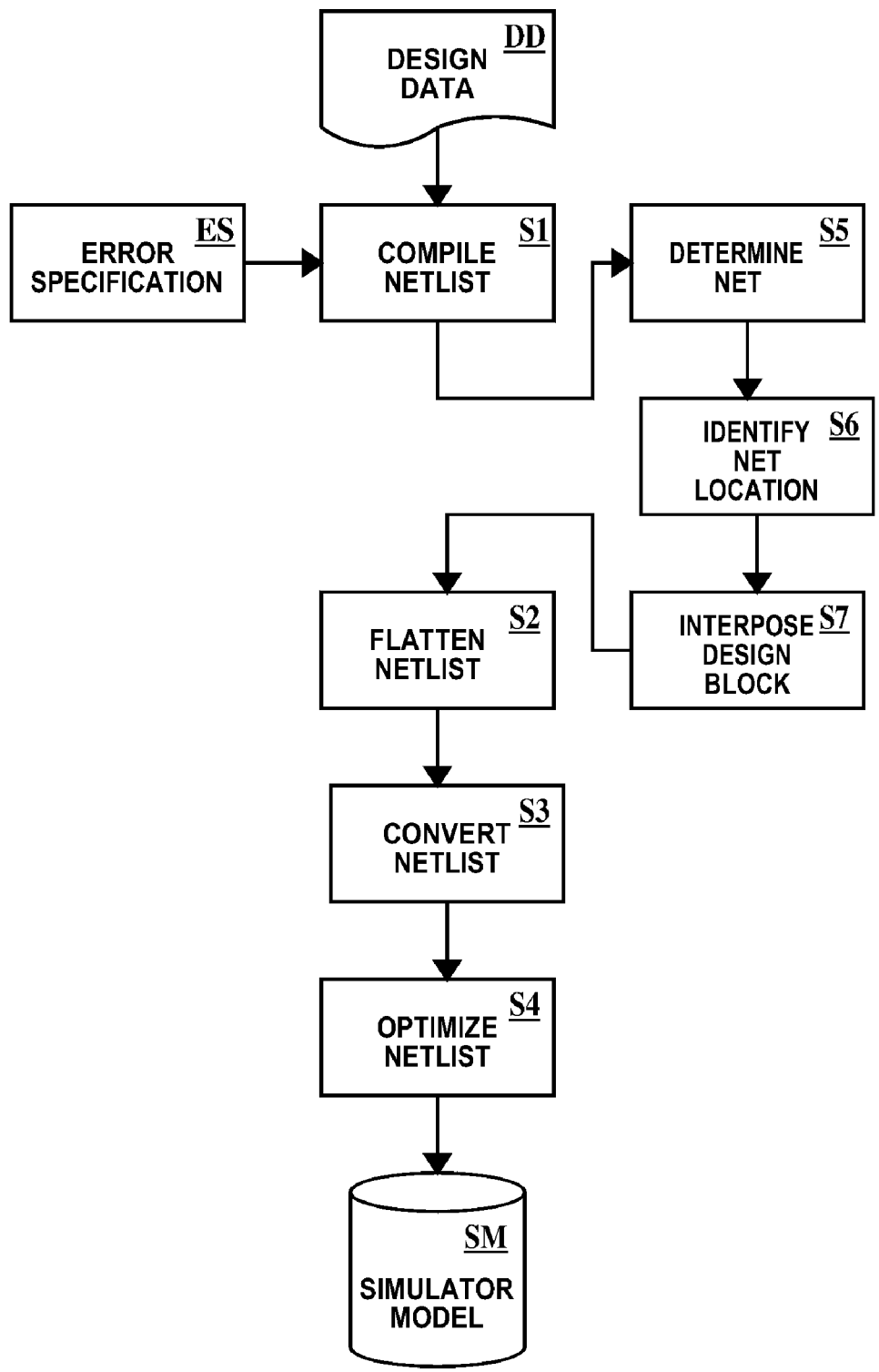

FIG. 2b shows a flow chart illustrating the emulator model build process according to the invention. Through the introduction of the error injection capability the process is enhanced by additional steps S5 . . . S7 (Step 5 . . . Step 7) that are inserted between compilation of the HDL description in S1 and the flattening of the netlist in S2.

As additional input ES (Error Specification) to the model build process, the user must designate the hierarchical instance name of the memory that should have errors injected. The representation thereof in this memory instance is then adapted during the model build process. This happens in three steps, which are detailed for the case where the representation of the surrounding read logic is changed. The process is analogous for a change in the surrounding write logic.

In S5 the desired net that implements the memory in the compiled net list is identified. It can be determined by type or by attribute. In the VHDL example description above, it is designated by its type RAM-TYPE=(array (0 to (addrtotal-1)) of std ulogic vector (0 to width-1)). To identify the net by attribute, an attribute would have to be added to the VHDL signal data array. An option-error_inject_awan may be provided with a hierarchical instance name of the array that should have the error injected.

Afterwards, in S6 a netlist location corresponding to a assignment is identified where the memory signal is assigned to the data output signal. In the above VHDL description, this is rwdataout0. The assignment is rwdataout0<=data_array (TConv (rwport0)), which finds the VHDL signal corresponding to the array having the errors and isolates the read output signal fed by the memory signal.

Finally, in S7 a design block is interposed between data out signal and memory signal, i.e. the simple assignment above is replaced by the block. It comprises the netlist equivalent of the HDL design block, as shown below. The function for converting the memory signal into the data out signal is given in bold letters. All signals are initialized to zero before continuing model build.

```
        BEGIN error_inject_block
--Added signals for error injection
--error injection enable signal
    SIGNAL inject_error     : std_ulogic := '0';
--value to stick the erroneous bit to
    SIGNAL stuckval: std_ulogic := '1';
--word line address of erroneous cell
    SIGNAL stuckwaddr       : std_ulogic_vector (0 to 4) := B"000001";
--bit address of erroneous cell
    SIGNAL stuckbaddr       : std_ulogic_vector (0 to 5) := B"00000";
    rwdataout0 <= data_array(TConv(rwport0));
    IF ((rwport0 = stuckwaddr) AND (inject_error = '1')) THEN
    rwdataout0(TConv(stuckbaddr)) <= stuckval; -- error injection
    END error_inject_block
```

The netlist with the interposed block allows for reliable error injection at arbitrary positions within the array. As the facilities related to error injection are design nets like VHDL signals, they can be changed dynamically during the runtime of the emulation. This would not be possible, if they were implemented as variables. The netlist, which has thus been enhanced with the error injection capability, then undergoes the remaining steps as in the usual model building process. The result is a changed representation of the design under test, i.e. an emulation model SME (Simulation Model Error) with error injection capability.

Although the example illustrates the automatic representation change of the design during the model build process, a secondary solution is also possible. In this case, the HDL architecture of the array entity in question could be changed manually. It would then show the same behavior as with the inserted error inject block described above.

In contrast thereto the implementation as model build option that allows for error injection consists of a different architecture, of which a possible implementation is shown in the example below. In the example only the read logic is changed, which is again indicated by bold letters. However, analogous changes can be effectuated on the write logic instead or in addition. By implementing the facilities related to error injection as VHDL signals, they can be changed dynamically during the runtime of the emulation. This would not be practical, if they were implemented as variables.

```
ENTITY memory_block IS
    PORT(
    rwport0             : IN std_ulogic_vector(0 to 4);
    rwdataout0          : OUT std_ulogic_vector(0 to 41);
    rwdatain0           : IN std_ulogic_vector(0 to 41);
    rwren0              : IN std_ulogic;
    rwwen0              : IN std_ulogic );
    END memory_block;
ARCHITECTURE allow_error_inject OF memory_block IS
    --Useful constants
    CONSTANT addrlen    : integer := 5;
    CONSIANT width      : integer := 42;
    CONSTANT addrtotal  : integer := 32;
    CONSTANT arraytotal : integer := 32;
    The type definition for the RAM
    TYPE RAM_TYPE IS ARRAY(0 TO addrtotal-1) OF
std_ulogic_vector(0 TO width-1);
    The RAM
        SIGNAL data_array : RAM_TYPE;
```

```
Added signals for error injection
error injection enable signal
    SIGNAL inject_error      : std_ulogic := '0';
value to stick the erroneous bit to
    SIGNAL stuckval : std_ulogic := '1';
word line address of erroneous cell
SIGNAL stuckwaddr      : std_ulogic_vector (0 to 4) := B"000001";
bit address of erroneous cell
SIGNAL stuckbaddr      : std_ulogic_vector (0 to 5) := B"00000";
    BEGIN - Architecture
writes into the array
WRITES : PROCESS (rwport0, rwwenO, rwdatain0)
BEGIN -- WRITES
read/write port 0 enabled
        IF (rwwen0 = '1') THEN
        Data_array(TConv(rwport0)) <= rwdatain0;
        END IF;
END PROCESS WRITES;
reads from array
READS : PROCESS (rwport0, rwren0)
BEGIN -- READS
    IF (rwren0 = '1') THEN
    rwdataout0 <= data_array(TConv(rwport0));
    IF ((rwport0 = stuckwaddr) AND (inject_error =
        '1')) THEN rwdataout0(TConv(stuckbaddr))
            <= stuckval; -- error injection
        END IF
        ELSE
        rwdataout0 <= (others => '1');
        END IF;
    END PROCESS READS;
END original;
```

What the invention provides for is 'Virtual Bit Fail Mapping,' since a virtual test object has been created, against which programs for Bit Fail Mapping can be developed and checked before silicon returns. The time-consuming debugging process is shifted to the phase where tester time is cheapest. Furthermore, the bit fails of the virtual object are reliable and configurable, allowing for thorough testing of the developed tester programs. This results in additional timesavings when tester time is most expensive. Also, no damaging of real hardware is needed to get test objects and FIB treatment can be avoided. Finally, overall time for bit-fail mapping is thus shortened.

The present invention can be realized in hardware, software, or a combination carrying out the methods described herein is suitable. A typical combination of hardware and software could be a general-purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods.

Computer program means or a computer program in the present context mean any expression, in any language, code or notation, of a set of instructions intended to cause a system having an information processing capability to perform a particular function either directly or after either or all of the following, namely conversion to another language, code or notation, or reproduction in a different material form.

Furthermore, the method described herein may take the form of a computer program product accessible from a computer-usable or computer-readable medium providing program code for use by or in connection with a computer or any instruction execution system. For the purposes of this description, a computer-usable or computer readable medium may be any apparatus that can contain, store, communicate, propagate, or transport the program for use by or in connection with the instruction execution system, apparatus, or device. The medium may be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk, read only memory (CD-ROM), compact disk, read/write (CD-RW), and DVD.

The invention claimed is:

1. A method for testing bit failures in memory array elements of an electronic circuit, said method comprising the steps of:
    using a computer, modifying a representation of said electronic circuit such that errors can be injected into said memory array elements via input signals of read, write, or both read and write logic of said memory array elements;
    building an emulator model from said modified representation;
    injecting errors into said memory array elements during an emulation of said emulator model; and
    wherein said representation of said electronic circuit is a hierarchical netlist and said modifying of said representation of said electronic circuit includes:
        identifying a desired array memory signal by type or attribute from said hierarchical netlist;
        identifying an assignment of said desired array memory signal to a data output signal in said hierarchical netlist; and
        inserting an equivalent of error injection behavioral between said data output signal and said memory signal.

2. The method according to claim 1, wherein said representation of said electronic circuit is modified before, in, or both before and in said building step.

3. The method according to claim 2, wherein in the emulation of said emulator model said input signals can be controlled from an emulator model input facility.

4. The method according to claim 3, wherein said errors can be turned on at configurable array memory addresses.

5. The method according to claim 2, wherein said errors can be turned on at configurable array memory addresses.

6. The method according to claim 1, wherein said errors can be turned on at configurable array memory addresses.

7. The method of claim 1, wherein the only the design of the read, write or both read and write logic blocks of said memory array are modified.

8. A computer program loadable into the internal memory of a digital computer comprising software code portions that when executed by said computer implement a method for testing bit failures in memory array elements of an electronic circuit, said method comprising:
    modifying a representation of said electronic circuit such that errors can be injected into said memory array elements via input signals of read, write, or both read and write logic of said memory array elements;
    building an emulator model from said modified representation;
    injecting errors into said memory array elements during an emulation of said emulator model; and
    wherein said representation of said electronic circuit is a hierarchical netlist and said modifying of said representation of said electronic circuit includes:

identifying a desired array memory signal by type or attribute from said hierarchical netlist;

identifying an assignment of said desired array memory signal to a data output signal in said hierarchical netlist; and inserting an equivalent of error injection behavioral between said data output signal and said memory signal.

9. The computer program according to claim 8, wherein said representation of said electronic circuit is modified before, in, or both before and in the building step.

10. The computer program according to claim 9, wherein in the emulation of said emulator model said input signals can be controlled from an emulator model input facility.

11. The computer program according to claim 10, wherein said errors can be turned on at configurable array memory addresses.

12. The computer program according to claim 8, the computer program comprising a non-transitory computer usable medium embodying program instructions executable by a computer, said embodied program instructions comprising a compiled computer program.

13. The computer program of claim 8, wherein the only the design of the read, write or both read and write logic blocks of said memory array are modified.

14. An emulation system for testing bit failures in memory array elements of an electronic circuit, comprising:

a test system including a test program;

a computer system including a representation of said electronic circuit, said test system connected to said computer system by an interface card;

said computer system configured to:

modify a representation of said electronic circuit such that errors can be injected into said memory array elements via input signals of read, write, or both read and write logic of said memory array elements;

build an emulator model from said modified representation;

inject errors into said memory array elements during an emulation of said emulator model; and wherein said representation of said electronic circuit is a hierarchical netlist and said computer system is further configured to:

identify a desired array memory signal by type or attribute from said hierarchical netlist;

identify an assignment of said desired array memory signal to a data output signal in said hierarchical netlist; and insert an equivalent of error injection behavioral between said data output signal and said memory signal.

15. The emulation system of claim 14, wherein said representation of said electronic circuit is modified before, in, or both before and in the building step.

16. The emulation system of claim 15, wherein said emulator model said input signals can be controlled from an emulator model input facility.

17. The emulation system of claim 16, wherein said errors can be turned on at configurable array memory addresses.

18. The emulation system of claim 14, wherein said computer program comprises a non-transitory computer usable medium embodying program instructions executable by the computer, said embodied program instructions comprising a compiled computer program.

19. The emulation system of claim 14, wherein the only the design of the read, write or both read and write logic blocks of said memory array are modified.

* * * * *